(12) United States Patent
Vestyck

(10) Patent No.: US 9,139,425 B2
(45) Date of Patent: Sep. 22, 2015

(54) PROCESS FOR MANUFACTURING ELECTRO-MECHANICAL SYSTEMS

(75) Inventor: Daniel J. Vestyck, Allentown, PA (US)

(73) Assignee: SPTS Technologies Limited, Newport (GB)

(*) Notice: Subject to any disclaimer, the term of this patent is extended or adjusted under 35 U.S.C. 154(b) by 0 days.

(21) Appl. No.: 13/992,118

(22) PCT Filed: Dec. 7, 2010

(86) PCT No.: PCT/US2010/059238
§ 371 (c)(1),
(2), (4) Date: Aug. 30, 2013

(87) PCT Pub. No.: WO2012/078139
PCT Pub. Date: Jun. 14, 2012

(65) Prior Publication Data
US 2013/0334628 A1    Dec. 19, 2013

(51) Int. Cl.
*H01L 21/00* (2006.01)
*H01L 29/84* (2006.01)
*B81C 1/00* (2006.01)

(52) U.S. Cl.
CPC ......... *B81C 1/00523* (2013.01); *B81C 1/00936* (2013.01)

(58) Field of Classification Search
CPC .. H01L 29/84; B81C 1/00523; B81C 1/00936
USPC .............................. 257/415, 418; 438/50–53
See application file for complete search history.

(56) References Cited

U.S. PATENT DOCUMENTS

2007/0231943 A1* 10/2007 Ouellet et al. .................. 438/50

* cited by examiner

*Primary Examiner* — Hung Vu
(74) *Attorney, Agent, or Firm* — McNees Wallace & Nurick LLC

(57) ABSTRACT

A method of avoiding stiction during vapor hydrofluoride (VHF) release of a microelectromechanical system (MEMS) or nanoelectromechanical system (NEMS) composed of a mechanical device and a substrate is described. A silicon nitride layer is provided between the substrate and a sacrificial oxide layer and/or between a device layer and the sacrificial oxide layer, and/or on a side of the device layer facing away from the sacrificial oxide layer, and converted to thicker ammonium hexafluorosilicate with VHF while simultaneously removing a portion of the sacrificial oxide. The ammonium hexafluorosilicate acts as a temporary support, shim, wedge, or tether which limits device movement during fabrication and is later removed by sublimation under heat and/or reduced pressure.

13 Claims, 6 Drawing Sheets

PROCESS FOR MANUFACTURING ELECTRO-MECHANICAL SYSTEMS

BACKGROUND OF THE INVENTION

This invention relates to the field of manufacturing electro-mechanical systems which includes nano-electro-mechanical systems (NEMS) and micro-electro mechanical systems (MEMS). More particularly the invention relates methods of making MEMS and NEMS using vapor hydrofluoric etching.

NEMS are modern mechanical systems in which one or more of the mechanical elements are smaller than one micron in all directions. NEMS and the older technology MEMS are well known devices which consist of long thin beams that support large plates, all patterned on top of a sacrificial layer and anchored to the underlying substrate at one or more points. After the device is completed, the sacrificial layer is etched away and the plate and beams are free to move except at the anchor points.

Many patents and other publications disclose various methods of making NEMS and MEMS. For example, Mastrangelo U.S. Pat. No. 5,258,097 disclosed a method of fabricating microstructures on a silicon substrate by depositing a sacrificial layer which can be removed by wet etching techniques such as silicon dioxide. Void areas are formed in the sacrificial layer and then a column-forming layer, resistant to sacrificial layer etchant, is deposited through at least one hole to fill the void area and undercut areas which later provides support for the structural layer during wet etching of the remaining sacrificial layer.

Others have addressed problems associated with NEMS which were not associated with MEMS, for example Carley, U.S. Pat. Pub. 2010/0061143, addressed the problem of constructing beams which have small aspect ratios by constructing them as independent, unattached objects. Rueckes, et al, U.S. Pat. No. 6,911,682, addressed the problem of controlling the statistical variance of geometries of nanotube wires or ribbons grown for memory cells. Beyer et al, U.S. Pat. No. 7,078,352, addressed the problem of isolation between interconnect lines by using air cavities which use hydrofluoric acid (HF) to dissolve sacrificial a $SiO_2$ layer by etching a hole and depositing an electroconductive material in the hole.

SUMMARY OF THE INVENTION

It is an object of the present invention to provide a method of securing moving parts of a device layer during manufacturing NEMS or MEMS. Another object of the invention is to provide a method of manufacturing NEMS or MEMS which does not result in stiction during or after removal of sacrificial oxide. A further object is to provide MEMS and NEMS which include features of a size, shape, and/or location not achievable via prior art methods.

These objects, and others which will become apparent from the following disclosure and the drawings, are achieved by the present invention which comprises in one aspect a method of securing moving parts of a device layer during manufacture of a MEMS or NEMS and the resulting MEMS or NEMS. A silicon nitride layer is provided between the substrate and a sacrificial oxide layer and/or between a device layer and the sacrificial oxide layer, and/or on a side of the device layer facing away from the sacrificial oxide layer, and converted to thicker ammonium hexafluorosilicate with vapor hydrofluoride (VHF) while simultaneously removing a portion of the sacrificial oxide. The ammonium hexafluorosilicate acts as a temporary support, shim, wedge, or tether which limits device movement during fabrication and is later removed by sublimation under heat and/or reduced pressure. In some embodiments the silicon nitride is not removed by sublimation until after one or more intermediate steps are conducted, the intermediate steps selected from dicing, packaging, and metallization, thereby preventing movement during the one or more intermediate steps.

VHF etching is typically used as an improved method over wet etching for small MEMS or NEMS, especially when stiction is a concern. Stiction occurs when residual water on the surface(s) of two flat, small parts, pulls them in contact with each other where Van der Wals forces can then bind them. For large sacrificial oxide gaps (>1 um) VHF process parameters like pressure, temperature and reactant ratios can aid in minimizing or eliminating the effects of stiction. However, when sacrificial oxide layers get very thin, and/or gaps between compliant features such as beams and springs become very narrow, as is the case with NEMS, there may be limitations to reducing water to a level that prevents stiction. One key reason is that a by-product of the reaction of VHF etching is water. So it is physically impossible to etch with no water present in the process. One can only reduce the flux of water generated by reducing the reaction rate, thereby reducing the etching rate. VHF is made and introduced according to known formulations and methods and comprises hydrofluoric acid and alcohol or water.

This invention exploits two unique phenomena that occur when using the VHF etch process on another standard semiconductor material, silicon nitride ($Si_3N_4$). It is known that silicon nitride in the presence of VHF processing can react and be converted to ammonium fluoride [$NH_4$]F and/or ammonium silicofluoride [$NH4$]$_2$$SiF_6$. These are fluoride salts and the converted layer of these salts tends to be thicker, having larger grain size than the starting silicon nitride material. The combined dual material film (ammonium silicofluoride over silicon nitride) grows in thickness when exposed to the etch process. The other phenomenon of converted silicon nitride salts is that they can be sublimed at relatively low temperatures and vacuum pressures according to the equation below.

$$(NH_4)_2SiF_6(s) \rightarrow NH_4HF_2(s)+SiF_4(g)+NH_3(g)$$

This invention exploits both these phenomena to develop a novel method of securing moving parts of a device layer either during a VHF release or during any processing subsequent to the VHF release. This is accomplished by using one or more nitride layers, either adjacent to a or adjacent to sacrificial oxide layer or across two or more moving parts. In embodiments wherein the nitride layer is between the device and oxide layers and/or between the oxide and substrate layers, the nitride layer thickness is selected so that its final thickness, when converted, approximates, but does not completely fill, the gap between the device layer and the substrate after the sacrificial oxide layer has been etched. This insures the device which was initially supported by the nitride/sacrificial oxide stack is now supported by an ammonium fluorosilicate layer or layers. In these embodiments an additional nitride layer can be placed above the device layer to counteract the bending force of the nitride layer below the device layer as it is converted. In embodiments where the nitride layer is used as a tether above the device layer, the nitride converts to ammonium fluorosilicate and tethers beams, springs, or other parts of the device layer together so that they are not damaged during further processing. The device layer in some embodiments is comprised of areas which are designed to move in relation to each other or in relation to the substrate, wherein a silicon nitride layer is provided in the form of a tether to limit movement of the areas in relation to each other during fabrication, and wherein the silicon nitride tether is removed by sublimation when movement of the areas in relation to each other is permitted.

The structure is then exposed to a vacuum bake at temperature and pressure conditions below the sublimation curve, thereby subliming the ammonium silicofluoride support structure so that the device is released with no water as part of the release process.

The device layer can be any suitable material used in the art, including for example amorphous silicon, polysilicon, silicon-germanium, aluminum, tungsten, titanium, titanium nitride, alloys of aluminum, tungsten, and titanium, combinations thereof, and metal-silicon oxide stacks.

BRIEF DESCRIPTION OF THE DRAWINGS

Other objects and advantages of the invention will become apparent upon reading the following detailed description and upon reference to the accompanying drawings in which.

DETAILED DESCRIPTION

While a few embodiments of the NEMS aspect of the invention are illustrated in detail below, it should be and will be understood by those skilled in this art that the invention also applies to other microelectromechanical systems (MEMS) as well as nanoelectro mechanical systems (NEMS) since the problems of avoiding stiction during release via VHF and preventing movement of device members such as beams, springs, and the like during processing steps applies to both formats.

Figure 1A:
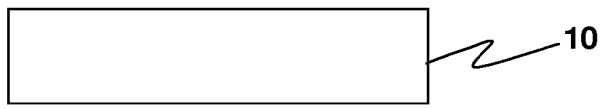
FIGS. 1a-1j are a series of cross-sectional views of an NEMS stack according to the invention illustrating the progression of building an NEMS stack by depositing layers onto a substrate, including three silicon nitride layers, patterning the stack, a VHF etching step, and a sublimation step.
Figure 1B:
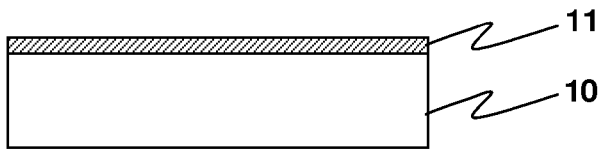
Figure 1C:
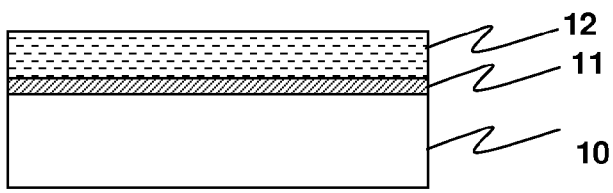
Figure 1D:
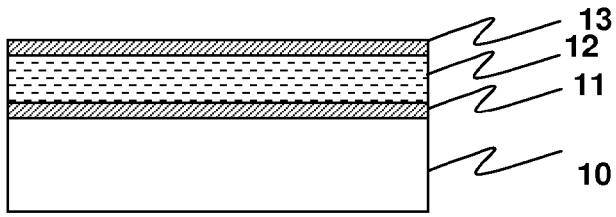
Figure 1E:
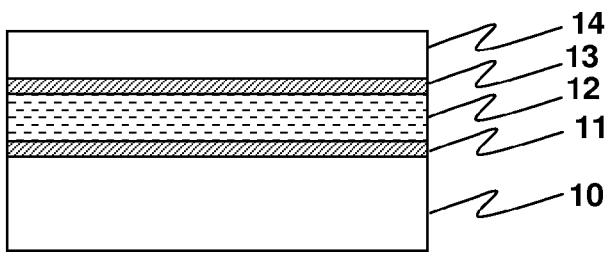
Figure 1F:
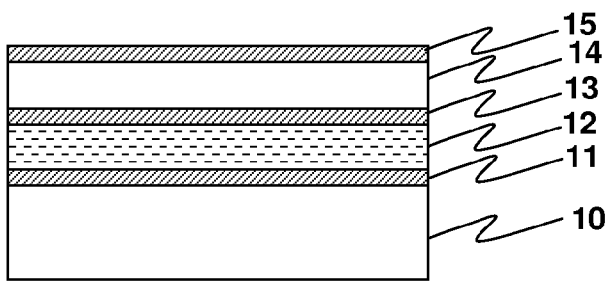

Referring first to FIGS. 1a-1j, an embodiment of an process according to the invention is illustrated wherein an NEMS stack is built and ultimately released in a series of steps. The starting substrate 10 is illustrated in FIG. 1a. One or more silicon nitride layers are deposited, depending on the embodiment. FIG. 1b illustrates a first silicon nitride layer 11, followed by deposit of a sacrificial oxide layer 12 (FIG. 1c), an intermediate silicon nitride layer 13 (FIG. 1d), a structure or device layer 14 (FIG. 1e), and a top nitride layer (FIG. 1f). In the illustrated embodiment the SiN layers are 200 Angstroms thick and the oxide layer is 500 Angstroms thick. The thickness of the structure or device layers can vary, even within a particular stack, as known in the art. In the illustrated embodiment, the device layer 14 is 500 Angstroms thick.

Figure 1G:
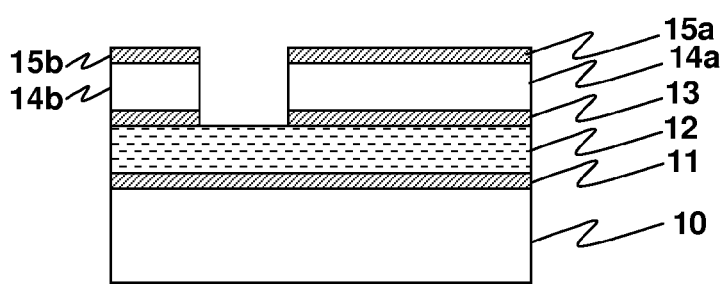
Figure 1H:
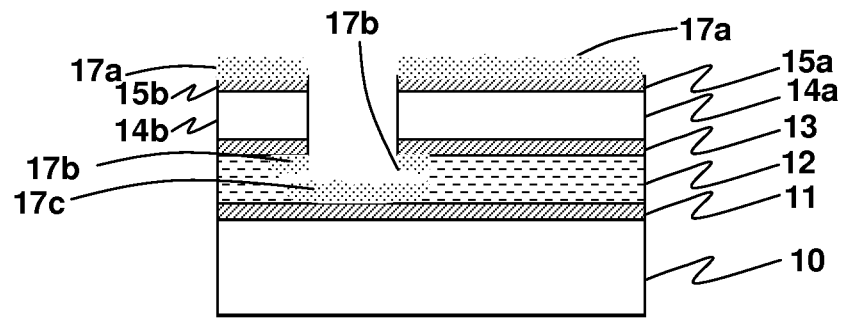

FIG. 1g illustrates a pattern being etched which divides layers 15, 14, and 13 into separate sections, 15a and 15b, 14a and 14b, and 13a and 13b, without etching the sacrificial oxide layer 12. FIG. 1h illustrates a the result of a partial VHF process release step which removes some sacrificial oxide 12 and simultaneously converts some of the silicon nitride, 11, 13a, 13b, 15a, 15b, into ammonium hexafluorosilicate 17a, 17b, 17c, or related chemistry which occupies greater volume than the silicon nitride which existed prior to the VHF step. The VHF comprises hydrofluoric acid (HF) and either alcohol or water vapor, and is introduced with nitrogen. The VHF step is conducted in this embodiment at 45 C. and 100 Torr, but temperatures of about 20-100 C and pressures of 10 Torr to atmospheric (760 Torr) are suitable in other embodiments. During this release step the SiN layers 17b and 17c expand as they react with the HF to form ammonium hexafluorosilicate as the oxide layer is being removed until the expanded SiN/ammonium hexafluoriosilicate layers come in close proximity to each other so as to prevent the beam from collapsing onto the substrate due to stiction. Expanded SiN/ammonium hexafluorosilicate 17a serves to counteract any stress imparted by layer 17b as it forms.

Figure 1I:
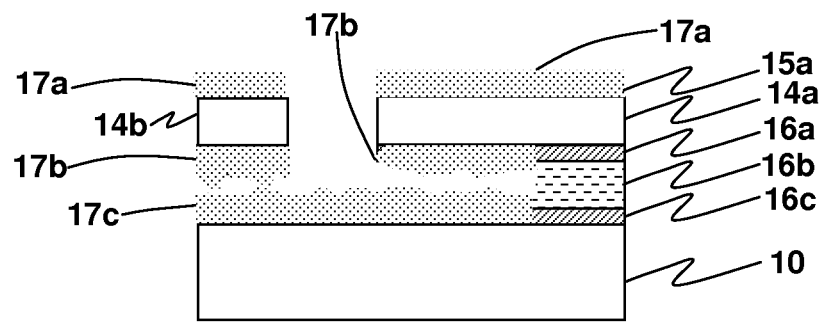
Figure 1J:
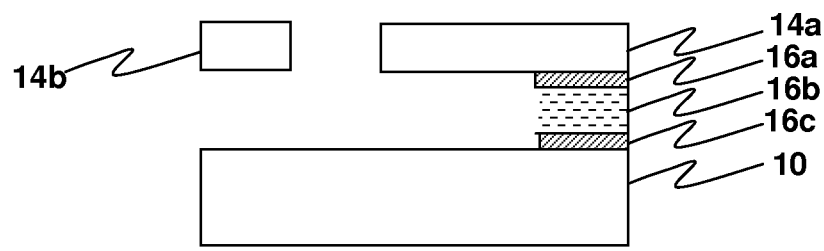

FIG. 1i illustrates the NEMS stack after a completed VHF release wherein ammonium hexafluorosilicate 17a supporting beams 14a and 14b from the top, ammonium hexafluorosilicate 17b is on the bottom of device layer 14a, 14b, and ammonium hexafluorosilicate 17c is on top of substrate 10. An anchor is formed from unreacted silicon nitride parts 16a and 16c and unreacted sacrificial oxide 16b. The anchor, 16a, 16b, 16c, supports the device part 14a in this embodiment, and remains in place after the sublimation step which results in the final device stack illustrated in FIG. 1j. FIG. 1j shows the ammonium hexafluorosilicate 17a, 17b, and 17c having been removed by the sublimation step.

Figure 2A:
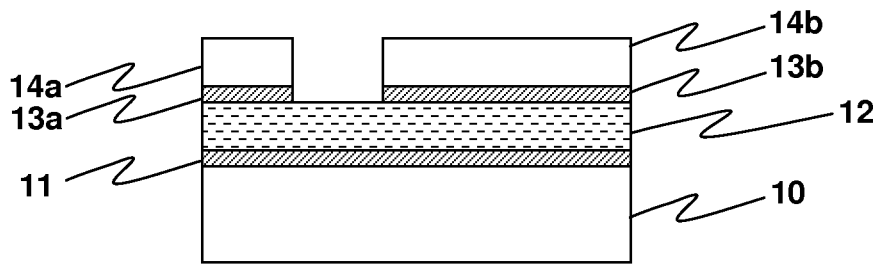
FIGS. 2a-2d are a series of cross-sectional views of an NEMS stack according to the invention illustrating the progression of VHF etching of a patterned NEMS stack which includes two silicon nitride layers, and a sublimation step.
Figure 2B:
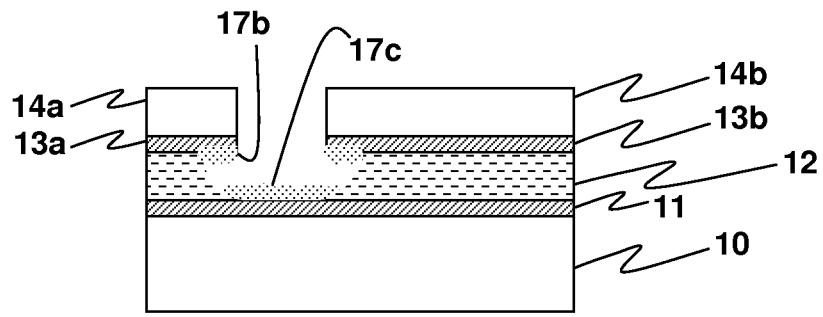
Figure 2C:
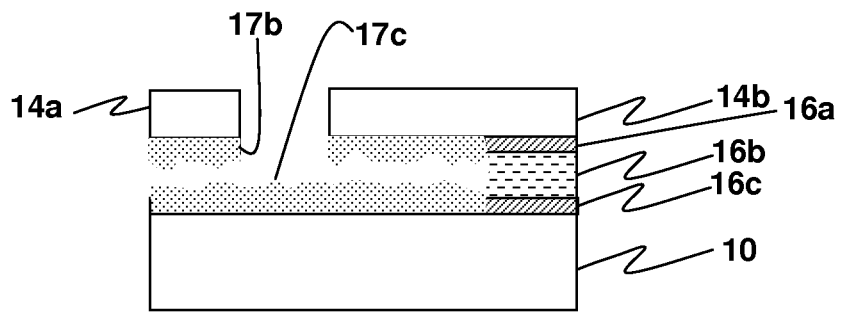
Figure 2D:
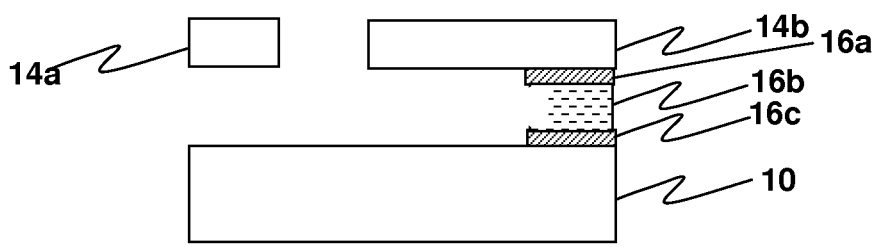

FIGS. 2a-2d are a series of cross-sectional views of an NEMS stack according to the invention illustrating the progression of VHF etching of a patterned NEMS stack which includes two silicon nitride layers 11 and 13a-13b, and a sublimation step. The patterned stack 2a is partially treated with VHF to convert a portion of each silicon nitride layer 11 and 13a-13b to expanded ammonium hexafluorosilicate 17b, 17c, and simultaneously remove a portion of the sacrificial oxide 12. FIG. 2c illustrates the stack after release and removal of all desired sacrificial oxide 12 (FIG. 2a), leaving the anchor for the beam 14b comprised of unreacted silicon nitride 16a, 16c, and unreacted sacrificial oxide 16b. The beam 14b is no longer supported and is now free to move as designed.

Figure 3A:
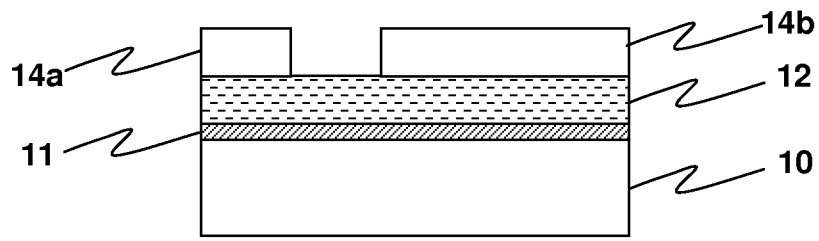
FIGS. 3a-3d are a series of cross-sectional views of a patterned NEMS stack with only one silicon nitride layer, partial treatment with VHF, completed VHF step, and sublimation to release the device layer.
Figure 3B:
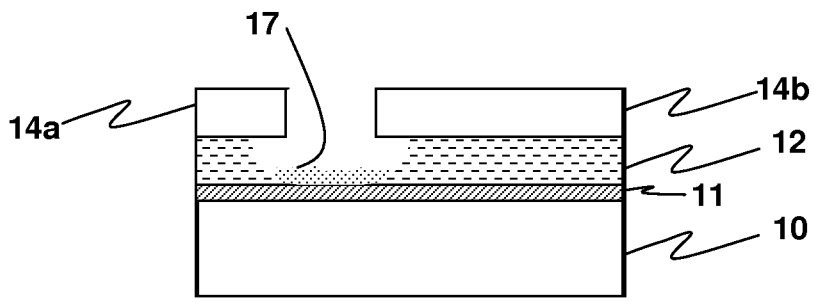
Figure 3C:
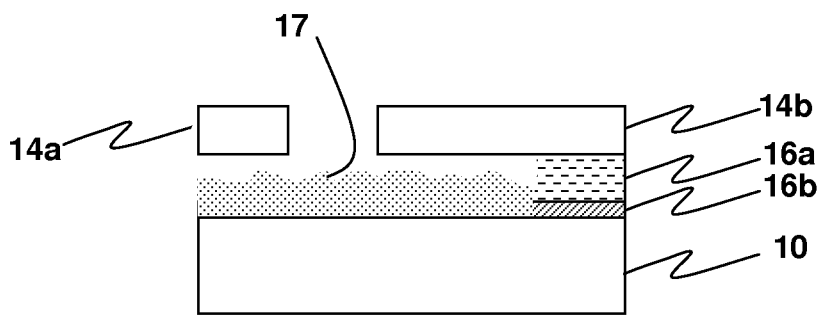
Figure 3D:
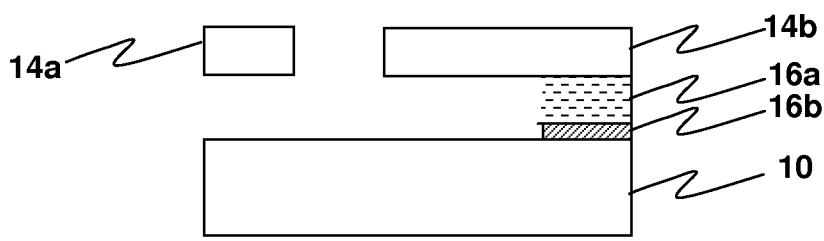

FIG. 3a-3d illustrate a stack with only one silicon nitride layer 11. A patterned device layer in FIG. 3a results in a beam 14b and another member 14a in a device layer, supported by a sacrificial oxide layer 12, which is deposited after the silicon nitride layer 11 on top of the starting substrate 10. FIG. 3b shows the result of partial VHF release, FIG. 3c show a completed VHF release with the anchor comprises of unreacted silicon nitride 16b and unreacted oxide 16a, wherein ammonium hexafluorosilicate 17 which is the expanded form of the silicon nitride supporting the beam 14b and member 14a. The ammonium hexafluorosilicate is removed anhydrously in the sublimation step resulting in a fully released NEMS device shown in FIG. 3d.

Figure 4A:
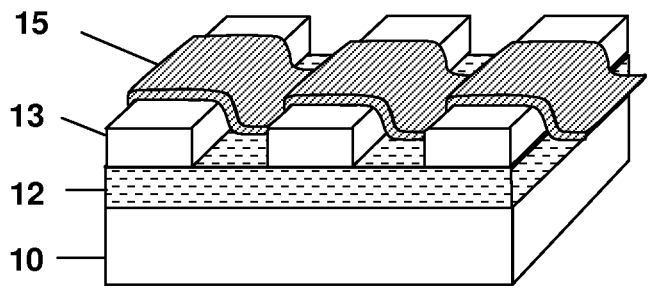
FIGS. 4a-4d are a series of perspective views, partially in cross-section, of a patterned NEMS stack comprising a silicon nitride tether layer functioning to maintain device layer parts from moving during VHF etching and subsequent process steps, and being removed during a sublimation step.
Figure 4B:
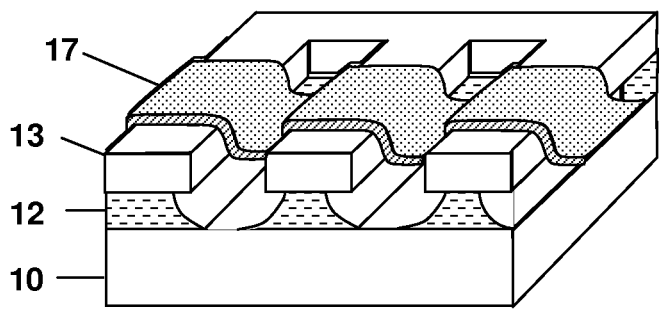
Figure 4C:
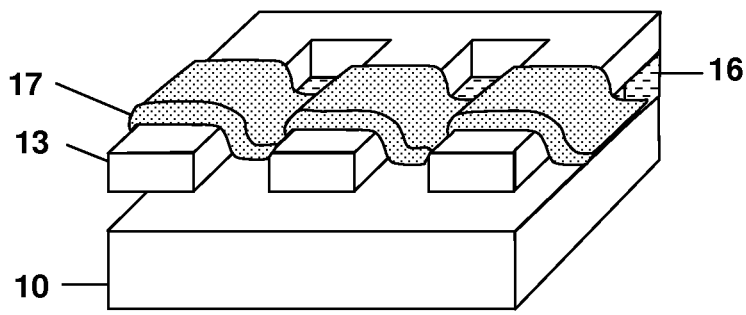
Figure 4D:
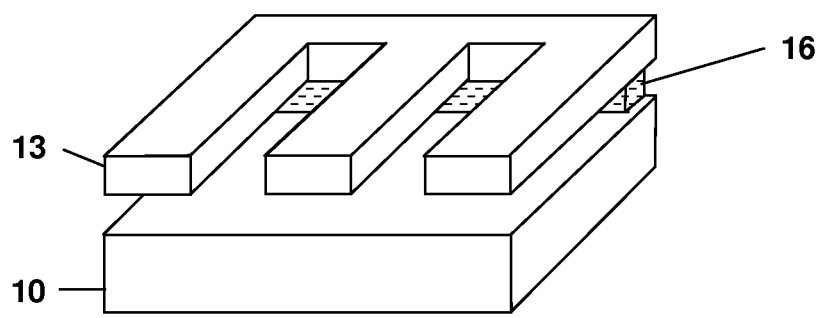

FIGS. 4a-4d illustrate another embodiment of the invention wherein a silicon nitride strip 15 is deposited over a pre-patterned device layer 13 in order to secure sections of the device layer 13 during the vapor HF release step. The silicon nitride 15 is converted to ammonium hexafluorosilicate 17 and portions of the sacrificial oxide 12 are removed during the VHF treatment step, resulting in an intermediate stack shown in FIG. 4b. A designed portion of sacrificial oxide 12 in FIG. 4c is not removed and functions as an anchor 16 which supports the sections or members 13 of the device layer in the final device after sublimation as shown in FIG. 4d.

Figure 5A:
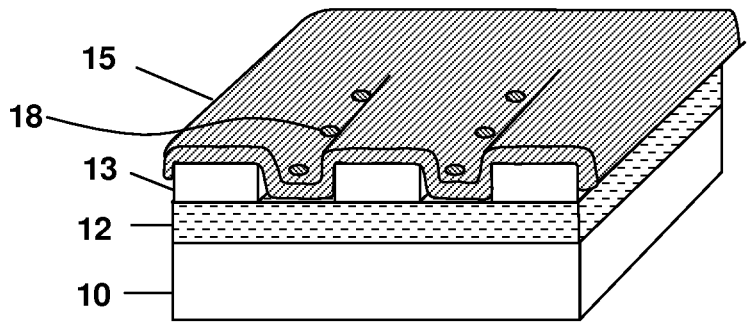
FIGS. 5a-5d are a series of perspective views, partially in cross-section, of a patterned NEMS stack comprising a silicon nitride tether layer, which is a different embodiment from FIGS. 4a-4d, functioning to maintain device layer parts from moving during VHF etching and subsequent process steps, and being removed during a sublimation step.
Figure 5B:
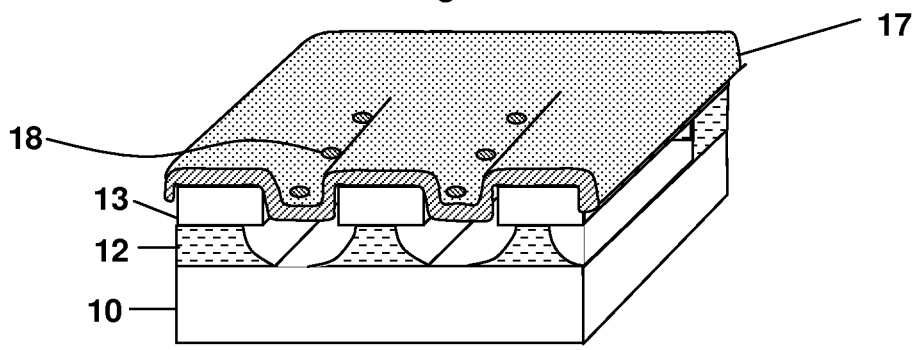
Figure 5C:
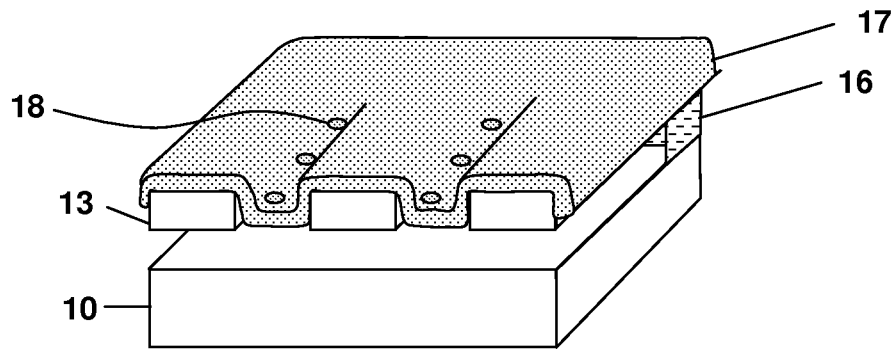
Figure 5D:
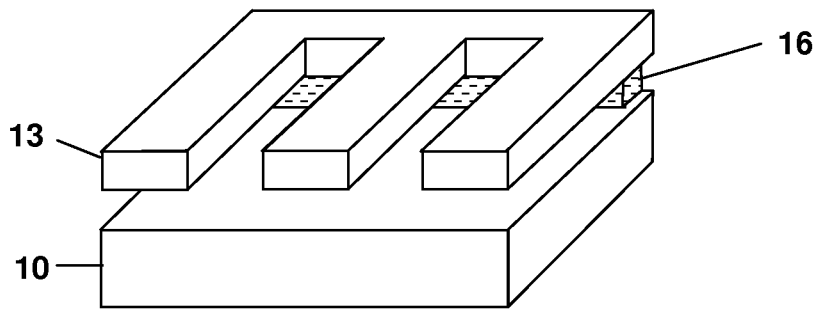

FIGS. 5a-5d are a series of perspective views, partially in cross-section, illustrating another embodiment of use of silicon nitride, at least partially converted to ammonium hexafluorosilicate as a tether of a patterned NEMS stack, functioning to maintain device layer parts from moving during VHF etching and subsequent process steps, and being removed during a sublimation step. In this embodiment, a device layer 13 is patterned on a sacrificial silicon oxide layer 12 which is on substrate 10 as shown in FIG. 5a. A silicon nitride layer 15 having etch holes 18 completely covers three moving beam members 13 of the device layer. Partial VHF etching removes some sacrificial oxide layer and converts some of the top silicon nitride layer to ammonium hexafluorosilicate, as shown in FIG. 5b. FIG. 5c illustrates complete oxide etching, leaving anchor 16 which is the remaining section or portion of the silicon oxide. FIG. 5d illustrates the result of sublimation under temperature and pressure conditions which avoid liquid formation. In this embodiment, the moving beam members 13 (FIG. 5c) are protected by the tether during steps such as dicing, packaging, metallization, and/or any steps which require protection of the device features. In addition to beams, members 13 can be springs and/or other moving parts in a MEMS or NEMS.

The method of the invention results in improved, unique MEMS and NEMS because it enables design of smaller parts, parts which are close to each other and/or to a substrate, which would normally be subject to stiction or damage during release steps, dicing, packaging, metallization, and the like.

The method of the invention method of invention for fabricating nano microelectromechanical systems composed of mechanical beams and substrates made of silicon, comprises depositing a thin layer of silicon nitride on a one or two sides of a beam, one or two sides of a substrate, or on at least one side of a beam and a substrate, and a silicon oxide sacrificial layer, the silicon nitride deposited on a location of the beam or substrate where support is needed when the sacrificial silicon oxide layer is removed during an etch step with vapor hydrofluoride ("VHF"), wherein a support structure residue is formed by converting the silicon nitride to ammonium fluoride and/or ammonium silicofluoride during the VHF etch step, the support structure residue configured to separate a beam or substrate from another beam or substrate during a dry release step, dry releasing, and then removing the support structure residue.

The present invention, therefore, is well adapted to carry out the objects and attain the ends and advantages mentioned, as well as others inherent therein. While the invention has been depicted and described and is defined by reference to particular preferred embodiments of the invention, such references do not imply a limitation on the invention, and no such limitation is to be inferred. The invention is capable of considerable modification, alteration and equivalents in form and function, as will occur to those ordinarily skilled in the pertinent arts. The depicted and described preferred embodiments of the invention are exemplary only and are not exhaustive of the scope of the invention. Consequently, the invention is intended to be limited only by the spirit and scope of the appended claims, giving full cognizance to equivalents in all respects.

What is claimed is:

1. A method of manufacturing a microelectromechanical system (MEMS) or nanoelectromechanical system (NEMS) composed of a mechanical device and a substrate comprising:
   a) depositing sacrificial silicon oxide between the mechanical device and the substrate;
   b) providing a silicon nitride layer at one or more location selected from the group consisting of
      i) between the substrate and the sacrificial silicon oxide:
      ii) between the sacrificial silicon oxide and the device; and
      iii) on the device;
   c) introducing vapor hydrofluoride (VHF) under conditions to simultaneously
      i) remove at least a portion of the sacrificial silicon oxide; and
      ii) convert at least a portion of the silicon nitride to ammonium hexafluorosilicate to provide a temporary support, shim, wedge, or tether which limits device movement;
   d) subliming the ammonium hexafluorosilicate under pressure and temperature conditions which avoid liquid formation;
   wherein the temporary ammonium hexafluorosilicate support, shim, wedge, or tether is not removed by sublimation until after one or more intermediate steps are conducted, the intermediate steps selected from dicing, packaging, and metallization, thereby preventing movement during the one or more intermediate steps.

2. The method of claim 1 wherein the device is selected from the group consisting of amorphous silicon, polysilicon, silicon-germanium, aluminium, tungsten, titanium, titanium nitride, alloys of aluminium, tungsten, and titanium, combinations thereof, and metal oxide stacks.

3. The method of claim 1 wherein the vapor hydrofluoride (VHF) comprises hydrofluoric acid and alcohol or water.

4. The method of claim 1 wherein the device, substrate, silicon oxide, and silicon nitride are provided as layers during fabrication of the MEMS or NEMS, and silicon nitride layers are provided on each side of the device layer.

5. The method of claim 1 wherein the device, substrate, silicon oxide, and silicon nitride are provided as layers during fabrication of the MEMS or NEMS, and first silicon nitride layer is provided on a side of the substrate layer facing the device layer and a second silicon nitride layer is provided on a side of the device layer facing the substrate layer, and a silicon oxide layer is provided between the first silicon nitride layer and the second silicon nitride layer.

6. The method of claim 1 wherein the device, substrate, silicon oxide, and silicon nitride are provided as layers during fabrication of the MEMS or NEMS, and the device layer is comprised of areas which are designed to move in relation to each other or in relation to the substrate, wherein a silicon nitride layer is provided in the form of a tether to limit movement of the areas in relation to each other during fabrication, and wherein the silicon nitride tether is removed by sublimation when movement of the areas in relation to each other is permitted.

7. The method of claim 1 wherein a portion of the sacrificial oxide is not removed and serves as an anchor.

8. The method of claim 1 wherein the silicon nitride is made with plasma-enhanced chemical vapour deposition (PECVD), or with low pressure chemical vapour deposition (LPCVD), the silicon nitride made with PECVD reacting faster than the silicon nitride made with the LPCVD.

9. The method of claim 1 wherein upon converting at least a portion of the silicon nitride to ammonium hexafluorosilicate, the ammonium hexafluorosilicate so formed has a greater volume than the portion of the silicon nitride.

10. The method of claim 1 wherein the amount and location of the ammonium hexafluorosilicate formed by reaction of the vapor hydrofluoride (VHF) with the silicon nitride is controlled by selection of location, thickness, and quality of the silicon nitride.

11. The method of claim 1 wherein the device is selected from the group consisting of amorphous silicon, polysilicon, silicon-germanium, aluminium, tungsten, titanium, titanium nitride, alloys of aluminium, tungsten, and titanium, combinations thereof, and metal-silicon oxide stacks; wherein the vapor hydrofluoride (VHF) comprises hydrofluoric acid and alcohol or water; wherein a portion of the sacrificial oxide is not removed and serves as an anchor; and wherein upon converting at least a portion of the silicon nitride to ammonium hexafluorosilicate, the ammonium hexafluorosilicate so formed has a greater volume than the portion of the silicon nitride.

12. A MEMS or NEMS made by the method of claim 11.

13. A MEMS or NEMS made by the method of claim 1.

* * * * *